US011081273B1

(12) United States Patent
Carver et al.

(10) Patent No.: US 11,081,273 B1
(45) Date of Patent: Aug. 3, 2021

(54) MAGNETIC FIELD GENERATION WITH THERMOVOLTAIC COOLING

(71) Applicant: Calagen, Inc., Portland, OR (US)

(72) Inventors: David Reginald Carver, Baton Rouge, LA (US); Sean William Reynolds, Baton Rouge, LA (US); Sean Claudius Hall, Baton Rouge, LA (US)

(73) Assignee: Calagen, Inc., Portland, OR (US)

( * ) Notice: Subject to any disclaimer, the term of this patent is extended or adjusted under 35 U.S.C. 154(b) by 0 days.

(21) Appl. No.: 17/317,498

(22) Filed: May 11, 2021

Related U.S. Application Data

(60) Division of application No. 16/152,321, filed on Oct. 4, 2018, which is a continuation-in-part of application No. 16/137,338, filed on Sep. 20, 2018.

(Continued)

(51) Int. Cl.

| | | |
|---|---|---|
| *H01F 27/08* | (2006.01) | |
| *H01F 27/28* | (2006.01) | |
| *H01L 35/28* | (2006.01) | |
| *H02P 7/00* | (2016.01) | |
| *H02M 3/00* | (2006.01) | |
| *H02K 21/02* | (2006.01) | |
| *H03B 5/08* | (2006.01) | |

(Continued)

(52) U.S. Cl.
CPC ............. *H01F 27/08* (2013.01); *H01F 27/28* (2013.01); *H01L 35/28* (2013.01); *H01L 35/30* (2013.01); *H02K 21/02* (2013.01); *H02M 3/00* (2013.01); *H02P 7/00* (2013.01); *H03B 5/08* (2013.01); *F25B 21/00* (2013.01); *F25B 2321/001* (2013.01); *H02J 50/10* (2016.02); *H05K 2201/10219* (2013.01)

(58) Field of Classification Search
CPC ......... H01F 27/08; H01F 27/28; H01L 35/30; H01L 35/28; H02M 3/00; H03B 5/08; H02K 21/02; H02P 7/00; H02J 50/10; H05K 2201/10219; Y02B 30/00; A61B 18/1206; A61B 18/14; A61N 1/32; A61N 1/18; F25B 2321/001; F25B 21/00
See application file for complete search history.

(56) References Cited

U.S. PATENT DOCUMENTS 3,170,130 A * 2/1965 Begley .................... H01L 35/00
336/55
3,343,009 A 9/1967 Wagini et al.
(Continued)

FOREIGN PATENT DOCUMENTS

EP 2 545 563 B1 1/2013

OTHER PUBLICATIONS

English translation of European Application EP 2 545 563 B1.
(Continued)

*Primary Examiner* — Emmanuel E Duke
(74) *Attorney, Agent, or Firm* — Klarquist Sparkman, LLP

(57) ABSTRACT

An apparatus can comprise a DC power supply to generate a DC electrical signal, a pulse generator to generate an electrical pulse, and an electrical element. The pulse generator and the DC power supply can be electrically coupled together. The electrical element can receive the DC electrical signal and the electrical pulse. The electrical element can generate a magnetic field in response to receiving the DC electrical signal and cool in response to receiving the electrical pulse.

20 Claims, 10 Drawing Sheets

Related U.S. Application Data

(60) Provisional application No. 62/568,244, filed on Oct. 4, 2017.

(51) Int. Cl.
*H01L 35/30* (2006.01)
*F25B 21/00* (2006.01)
*H02J 50/10* (2016.01)

(56) References Cited

U.S. PATENT DOCUMENTS

| | | | |
|---|---|---|---|
| 3,487,334 | A | 12/1969 | Eastman et al. |
| 4,000,482 | A * | 12/1976 | Staub .................... H01F 27/322 336/60 |
| 4,041,412 | A | 8/1977 | Malone |
| 6,595,004 | B1 | 7/2003 | Ghoshal |
| 7,816,601 | B2 | 10/2010 | Carver |
| 8,538,529 | B2 | 9/2013 | James et al. |
| 2007/0175217 | A1 | 8/2007 | Fellows |
| 2007/0253227 | A1 | 11/2007 | James et al. |
| 2008/0303375 | A1 | 12/2008 | Carver |
| 2009/0133409 | A1 * | 5/2009 | Chen .................... H01L 23/473 62/3.6 |
| 2011/0242855 | A1 | 10/2011 | Jovcic |
| 2012/0086533 | A1 * | 4/2012 | Wei .................... H01F 27/08 336/5 |
| 2013/0207763 | A1 * | 8/2013 | Wagoner ................. H01F 27/08 336/60 |
| 2014/0062635 | A1 * | 3/2014 | Delanoe .................. H01F 27/10 336/61 |
| 2015/0262762 | A1 | 9/2015 | Ikenuma et al. |
| 2015/0267944 | A1 * | 9/2015 | Duwel .................... H01F 1/015 62/3.1 |
| 2016/0128141 | A1 | 5/2016 | Makosinski et al. |
| 2019/0103211 | A1 | 4/2019 | Carver et al. |
| 2019/0103538 | A1 | 4/2019 | Carver et al. |
| 2019/0363236 | A1 | 11/2019 | Carver et al. |
| 2020/0343432 | A1 | 10/2020 | Carver et al. |

OTHER PUBLICATIONS

International Search Report dated Jan. 21, 2019, issued by the European Patent Office in PCT/US2018/052048, filed Sep. 20, 2018; 4 pages.

International Search Report and Written Opinion for PCT/US2018/054453, dated Jan. 24, 2019, 15 pages.

International Search Report and Written Opinion for PCT/US2020/046994, dated Oct. 23, 2020, 16 pages.

Ned Mohan et al: "13-6-2 Power Electronic Converter, 13-6-3 Ripple in the Armature Current"; In: "Power electronics : converters, applications, and design", Dec. 31, 1995 (Dec. 31, 1995), John Wiley & Sons, Inc., New York, Chichester, Brisbane, Toronto, Singapore, XP055543330, ISBN: 978-0-471-58408-7 pp. 386-389, figures 13.10, 13.11.

Ned Mohan et al: "14-7 Variable Frequency PWM-VSI Drives"; In: "Power electronics : converters, applications, and design", Dec. 31, 1995 (Dec. 31, 1995), John Wiley & Sons, Inc., New York, Chichester, Brisbane, Toronto, Singapore, XP055543331, ISBN: 978-0-471-58408-7 pp. 419-420, figure 14.19.

Written Opinion dated Jan. 21, 2019, issued by the European Patent Office in PCT/US2018/052048, filed Sep. 20, 2018; 8 pages.

* cited by examiner

MAGNETIC FIELD GENERATION WITH THERMOVOLTAIC COOLING

CROSS REFERENCE TO RELATED APPLICATION

This application is a divisional of U.S. patent application Ser. No. 16/152,321, filed Oct. 4, 2018, which claims priority from U.S. Provisional Application No. 62/568,244, filed Oct. 4, 2017, and from U.S. patent application Ser. No. 16/137,338 filed Sep. 20, 2018, which applications are incorporated herein by reference in their entirety.

FIELD

This invention relates to magnetic field generation. More specifically, this invention relates to magnetic field generation with thermovoltaic cooling.

BACKGROUND

Electronic circuits can be used to generate magnetic fields for various applications (e.g., motors). This type of circuit typically generates heat during operation, which can limit the strength of magnetic fields that can be generated. For example, current limits are typically established to ensure the circuit does not overheat. Cooling the circuit can increase the circuit's ability to receive additional current and create a stronger magnetic field.

SUMMARY

The following disclosure relates to improvements in magnetic field generation. The embodiments disclosed herein provide methods and apparatus for magnetic field generation with thermovoltaic cooling.

In one representative embodiment, an apparatus can comprise a DC power supply to generate a DC electrical signal, a pulse generator to generate an electrical pulse, and an electrical element. The pulse generator and the DC power supply can be electrically coupled together. The electrical element can be configured to receive the DC electrical signal and the electrical pulse. The electrical element can be configured to generate a magnetic field in response to receiving the DC electrical signal and to cool in response to receiving the electrical pulse.

In any of the disclosed embodiments, cooling the electrical element can increase the capacity of the electrical element to receive DC current. In any of the disclosed embodiments, the electrical element can comprise an inductive element. In any of the disclosed embodiments, the electrical element can have an inductance of greater than 1 nH. In any of the disclosed embodiments, the pulse generator can be configured to generate an electrical pulse that has a change in voltage with respect to time of at least 100 volts per second.

In any of the disclosed embodiments, the apparatus can further comprise an energy recovery element coupled to the electrical element. The electrical element can be configured such that when it receives the electrical pulse, it converts heat into electrical energy that is received by the energy recovery element. In any of the disclosed embodiments, an output of the energy recovery element can be coupled to the DC power supply.

In any of the disclosed embodiments, the DC electrical signal and the electrical pulse can be combined by applying the DC electrical signal and the electrical pulse to opposed windings of a transformer. For example, one of the DC electrical signal and the electrical pulse can be applied to the primary winding of the transformer and the other of the DC electrical signal and the electrical pulse can be applied to the secondary winding of the transformer. In any of the disclosed embodiments, one of the electrical element and the recovery element can comprise the primary winding of a transformer and the other of the electrical element and the recovery element can comprise the secondary winding of the transformer.

In another representative embodiment, an apparatus can comprise a DC power supply to generate a DC electrical signal, a first electrical element coupled to the DC power supply, a pulse generator to generate an electrical pulse, and a second electrical element. The first electrical element can be configured to receive the DC electrical signal and generate a magnetic field in response to receiving the DC electrical signal. The second electrical element can be configured to receive the electrical pulse and cool in response to receiving the electrical pulse. The first electrical element can be thermally coupled to the second electrical element such that when the second electrical element is cooled, the first electrical element is cooled.

In any of the disclosed embodiments, the second electrical element can be configured to convert heat into electrical energy in response to receiving the electrical pulse. In any of the disclosed embodiments, the apparatus can further comprise an energy recovery element to store the electrical energy generated by the second electrical element receiving the electrical pulse. In any of the disclosed embodiments, the electrical energy generated by the second electrical element can be applied to the DC power supply.

In any of the disclosed embodiments, the apparatus can further comprise an oscillator connected to the electrical element. In any of the disclosed embodiments, the apparatus can further comprise a primary oscillator and a secondary oscillator connected to the electrical element.

In another representative embodiment, a method can comprise generating a DC electrical signal, generating an electrical pulse, combining the DC electrical signal and the electrical pulse into a combined electrical signal having a DC electrical signal component and an electrical pulse component, and applying the combined electrical signal to an electrical element. The electrical element can be configured to generate a magnetic field in response to receiving the DC electrical signal component and to cool in response to receiving the electrical pulse component.

In any of the disclosed embodiments, the electrical element can comprise an inductive element. In any of the disclosed embodiments, the method can further comprise applying electrical energy generated by the electrical element in response to receiving the electrical pulse to a power supply that generates the DC electrical signal.

The foregoing and other objects, features, and advantages of the invention will become more apparent from the following detailed description, which proceeds with reference to the accompanying figures.

DETAILED DESCRIPTION

This disclosure concerns embodiments of magnetic field generators with thermovoltaic cooling. Magnetic field generation is useful for a variety of applications such as electric motors, magnetic imaging, etc. A device for generating a magnetic field can include a coil or solenoid in which a conductor (e.g., a copper wire) is wound around a core (e.g., an air core, an iron core). Each turn of the winding around the core can create a magnetic field such that the overall magnetic field strength generated by device is proportional to the number of turns in the winding. The magnetic field strength of the device is also proportional to the amount of current passed through the coil.

As current is passed through the coil of a magnetic field device, the coil becomes heated due to Joule heating. As the current through the coil is increased, the temperature of the coil increases. At a certain temperature, the coil may no longer function properly due to overheating, which can inhibit the ability of the coil to carry increased current or can cause the coil to physically degrade. In addition, as the temperature of the coil rises, its resistance may increase, further reducing its ability to carry increased current. Thus, the strength of the magnetic field that can be generated by the device is limited by the amount of heating the coil can undergo before breaking down or losing functionality.

This overheating problem can be mitigated by insulating the coil or using a heavier gauge wire that can carry more current before overheating becomes a problem. However, each of these solutions increases the diameter of the coil, which thereby limits the number of turns per unit volume that the winding of the coil can comprise, and limits the strength of the magnetic field that can be generated. Other more elaborate methods of cooling the coil can greatly increase the cost of operating the device. Accordingly, what is needed is a way to reduce the temperature of a coil. Apparatus and methods for accomplishing this goal are disclosed herein.

Figure 1:
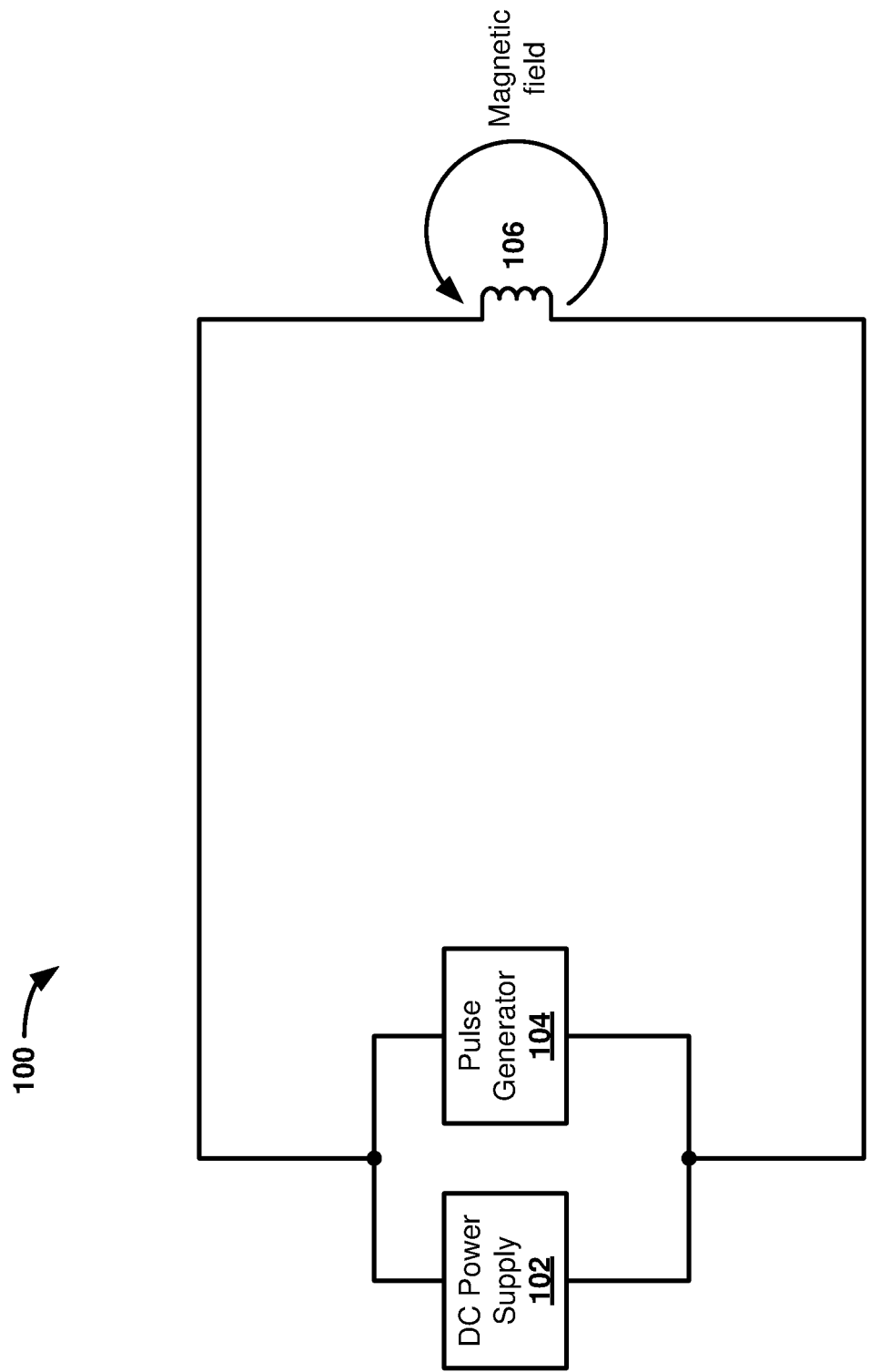
FIG. 1 is a block diagram of an exemplary magnetic field generator.

FIG. 1 shows an embodiment of a magnetic field generation system of circuit 100. The circuit 100 comprises a DC power supply 102, a pulse generator 104, and an electrical element 106. The DC power supply 102 can generate a constant direct current (DC) current. The DC power supply 102 can comprise a battery, a capacitor, an operational amplifier (op-amp), or other sources that can output a DC current. The electrical element 106 can comprise a device that generates a magnetic field when a DC current is applied to it. In the illustrated embodiment, the electrical element 106 is an inductor comprising a wire wound into a coil around a core. As the DC current from the DC power supply 102 passes through the inductor 106, a magnetic field is generated. The strength of the magnetic field is proportional to the strength of the DC current and the number of windings in the coil. The amount of DC current output by the DC power supply 102 can vary depending on the application for which the circuit 100 is used. Most motors require a DC output of 0.1-10 A. Electric cars can require 100-1000 A. As explained above, as the DC current passes through the inductor 106, it increases in temperature due to Joule heating and the magnetic field strength that can be generated by the circuit 100 is limited by this heating.

The pulse generator 104 can be a device that generates an electrical pulse. In some embodiments, the pulse generator 104 can generate a continuous stream of electrical pulses at periodic intervals. Ideally, the pulse generator 104 generates an electrical pulse in which the voltage output by the pulse generator increases rapidly over a short period of time. This could be done with a square wave with a short rise time, or a sine wave, a saw-tooth wave, or similar output voltage wave with a high frequency. The circuit 100 can function with a pulse output by the pulse generator 104 having a dV/dt ratio (e.g., a change in voltage over a period of time) as small as 100 V/s. However, the pulse generator 104 can output a pulse having a dV/dt of at least 100 V/µs or even 10,000 to 100,000 V/µs or higher.

When the pulse generator 104 outputs an electrical pulse having a high dV/dt ratio, the inductor 106 converts thermal energy to electrical energy and cools, as described herein. When the electrical pulse output by the pulse generator 104 with a high dV/dt ratio is applied to one side of the inductor 106, the electrical element gets colder and a voltage appears on the other side the electrical element with a higher power level than what was produced by the pulse generator. As such, the sharp pulse output by the pulse generator 104 causes the inductor 106 to convert thermal energy into electrical energy, thereby cooling the inductor. The higher the dV/dt ratio of the pulse output by the pulse generator 104, the greater the amount of thermal energy will be converted to electrical energy, and the more the inductor 106 will be cooled. This phenomena can be referred to as Kinetic Power Transient (KPT).

In motor driving, the instantaneous aspect of the electrical drive can be considered to be a DC signal relative to the rate of change in the magnetic field. Thus, although the "drive" may appear to be an AC signal with current reversals, the actual magnetic field and its effect is a DC phenomenon. The KPT effect described above can be applied on a time scale such that the conversion of heat from Joule heating in the inductor 106 to electrical energy is converted at such a rate as to provide cooling of the inductor. Externally, this signal for the KPT effect to occur may be thought of as an AC signal as well as the AC drive signal. However, on the shorter time scale where the cooling actually occurs, it is modeled adequately by DC.

As shown in FIG. 1, the outputs of the DC power supply 102 and the pulse generator 104 are combined. The amplitude of the electrical pulses output by the pulse generator 104 can be smaller than the amplitude of the voltage output by the DC power supply 102. In the illustrated embodiment, the amplitude of the pulses generated by the pulse generator 104 is between 1-10% of the amplitude of the DC voltage of the power supply 102. Furthermore, the inductor 106 is generally slow to respond to these pulses, particularly if the pulses have a high frequency, a narrow pulse-width, or if the inductor has a high inductance. In the illustrated embodiment, the inductance of the inductor 106 can be at least 1 nH or lower but can be greater than 400 In the illustrated embodiment, the output of the pulse generator 104 has a frequency of at least 2 kHz and can be between 1-5 MHz. For all these reasons, the magnetic field caused by the DC current from the DC power supply 102 passing through the inductor 106 may be altered slightly by the pulses output by the pulse generator 104 but is largely undisturbed.

In the illustrated embodiment, the pulses output by the pulse generator 104 have a positive voltage. However, in some embodiments, the output of the pulse generator 104 can be negative for at least part of the pulse. In the illustrated embodiment, the combined output signal of the DC power supply 102 and the pulse generator 104 is a positive voltage with perturbations around the DC output of the supply 102. However, in some embodiments, the combined output of the DC power supply 102 and the pulse generator 104 can be negative during certain periods of time if a portion of a pulse output by the pulse generator has a negative voltage greater than the positive voltage of the DC power supply.

If the pulse generator 104 continually outputs electrical pulses at periodic intervals, the inductor 106 continually converts thermal energy to electrical energy and cools with each pulse. This reduces the temperature increase of the inductor 106 caused by the DC current from the DC power supply 102. This, in turn, allows the current from the DC power supply 102 to be increased without overheating the inductor 106. Accordingly, this allows the system 100 to generate a magnetic field of greater strength than would be possible in a system without the presence of the pulse generator 104. Alternatively, the system 100 can be used to generate a magnetic field from an inductor 106 comprising a smaller gauge wire than would be necessary to generate the same strength magnetic field in a system without the presence of the pulse generator 104. This can reduce the cost and size of the circuit 100 compared to other circuits that are able to generate a comparable magnetic field.

The amount of cooling of the inductor 106 that can be achieved by the pulse generator 104 depends on the dV/dt ratio of the pulses output by the pulse generator, as well as other factors including the gauge of the wire that comprises the inductor 106. In some embodiments, the amount of Joule heating of the inductor 106 caused by the DC current output by the DC power supply 102 is exactly cancelled out by the cooling caused by the output of the pulse generator 104. In these embodiments, the inductor 106 generates a magnetic field without increasing its temperature at all and the circuit 100 can be thought of as analogous to a superconductor.

Figure 2:
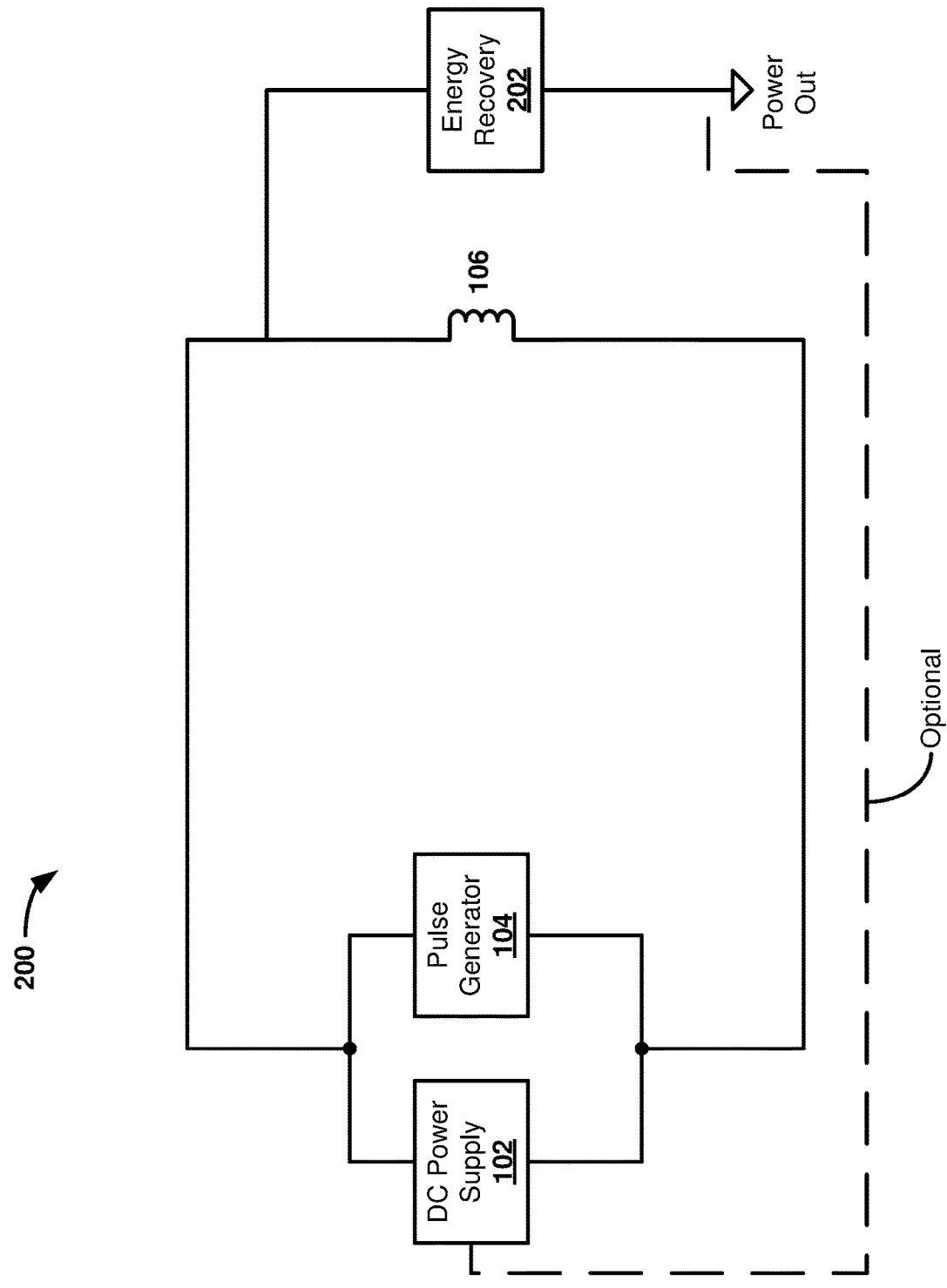
FIG. 2 is a block diagram of another exemplary magnetic field generator that includes an energy recovery element.

FIG. 2 shows an exemplary embodiment of another magnetic field generation circuit 200. In the embodiment of FIG. 2, the circuit 200 includes the DC power supply 102 and the pulse generator 104 whose output is combined and applied to the inductor 106. As with the example of FIG. 1, the output of the DC power supply 102 causes the inductor 106 to generate a magnetic field and the output of the pulse generator 104 causes the inductor 106 to cool, thereby increasing the capacity of the inductor to receive additional current from the DC power supply 102 and generate additional magnetic field strength without overheating. In addition, the circuit 200 includes an energy recovery element 202 in parallel with the inductor 106.

As explained above, the KPT effect that occurs when the inductor receives an electrical pulse from the pulse generator 104 having a high dV/dt ratio not only causes the inductor 106 to cool but also causes the inductor to convert thermal energy into electrical energy, thereby creating a voltage across the inductor having greater electrical energy than the combined energy output by the DC power supply 102 and the pulse generator 104. In circuit 200, this extra energy is tapped by the energy recovery element 202. In some embodiments, the energy recovery element 202 stores this generated electrical energy (e.g., in a capacitor or battery). In other embodiments, this extra energy created is fed back into the DC power supply 102 to help power the supply. In these embodiments, the Joule heating of the inductor 106 is used to at least partially power the circuit 200, thereby reducing the power requirements and increasing the efficiency of the circuit.

Figure 3:
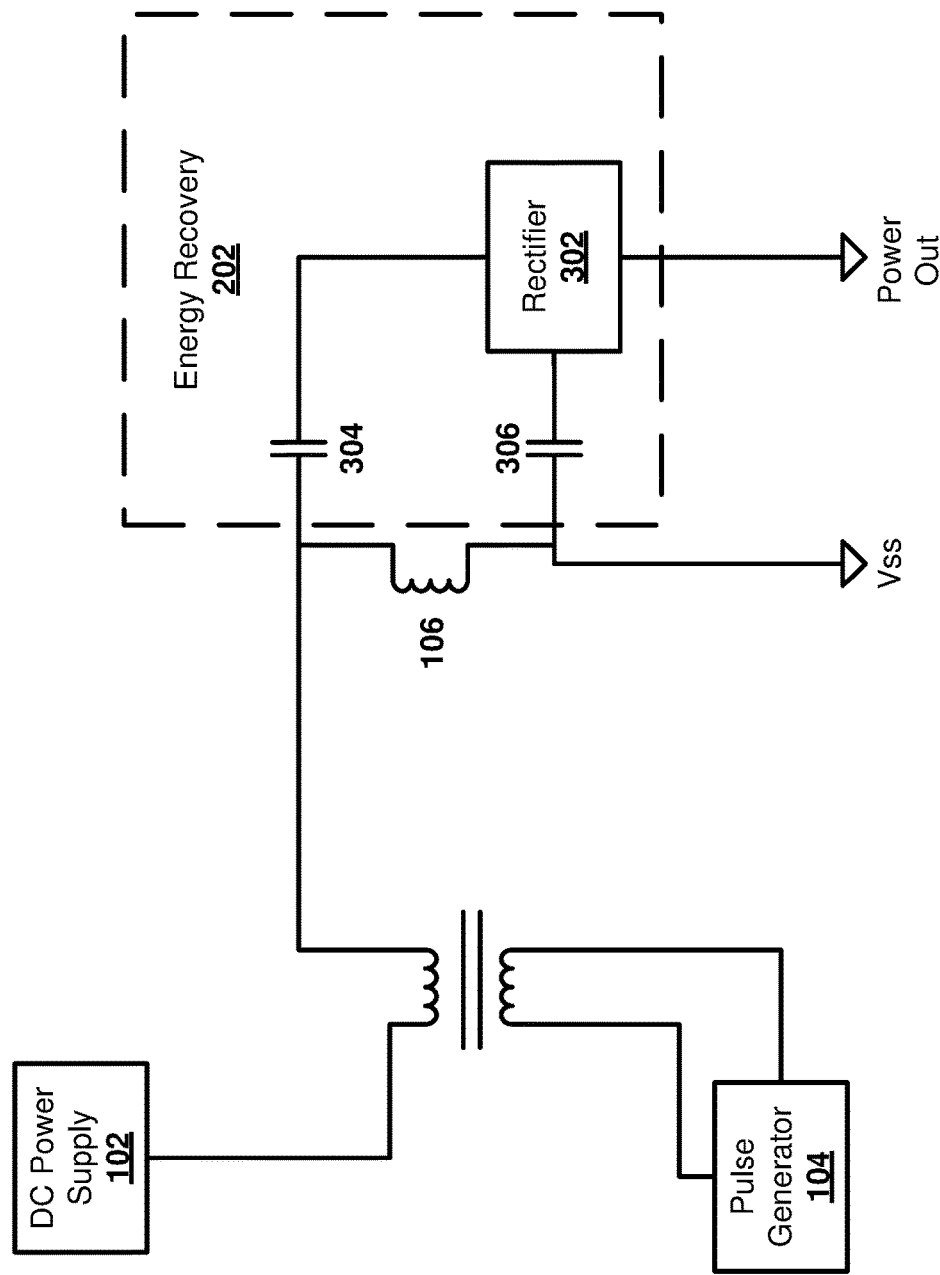
FIG. 3 is a block diagram showing further details of the energy recovery element of FIG. 2.

FIG. 3 shows an exemplary embodiment of another magnetic field generation circuit 300. In the embodiment of FIG. 3, the circuit 300 includes the DC power supply 102, the pulse generator 104, the inductor 106 and the energy recovery element 202. In circuit 300, the energy recovery element 202 comprises a rectifier 302, and capacitors 304, 306. The capacitors 304, 306 can remove the excess alternating current (AC) component from inductor 106 without interrupting the flow of DC current. The rectifier 302 can convert any AC power to DC and output only DC power. In some embodiments, the rectifier 302 can be omitted and the energy recovery 302 can output AC power. Although the energy recovery element 202 is shown tapped at a positive side of the inductor 106, it can be coupled to a negative side of the inductor.

Figure 4:
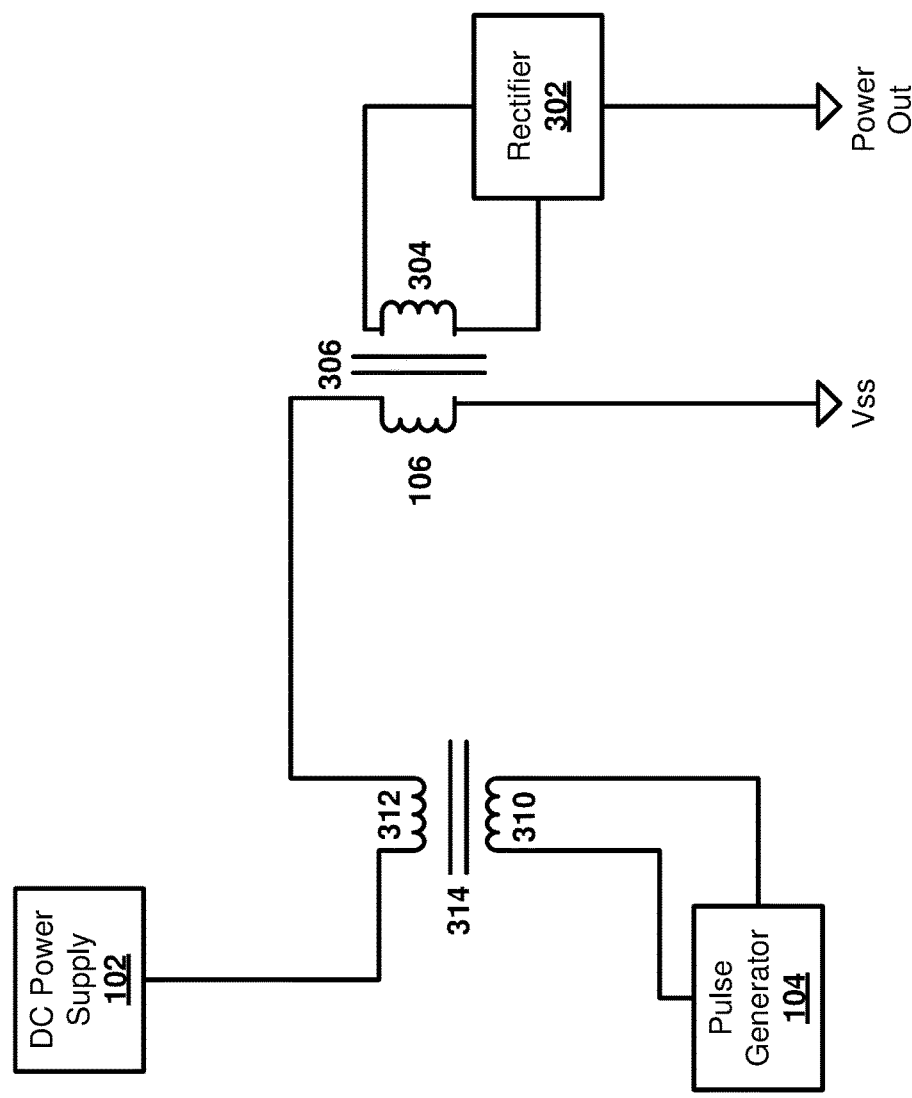
FIG. 4 is a block diagram of another exemplary magnetic field generator.

FIG. 4 shows an exemplary embodiment of another magnetic field generation circuit 400. In the embodiment of FIG. 4, the circuit 400 includes the DC power supply 102, the pulse generator 104, the inductor 106 and the rectifier 302. The output of the pulse generator 104 can be coupled to a coil 310 and the output of the DC power supply 102 can be coupled to a coil 312. The coils 310, 312 can be wrapped around a core 314 (e.g., an iron core) such that they comprise the primary and secondary windings of a transformer, thereby combining the outputs of the DC power supply 102 and the pulse generator 104.

The circuit 400 can further include a coil 304 and a core 306. The inductor 106 and the coil 304 can be wrapped around the core 306 to comprise a transformer that couples the inductor 106 to the coil 304. This allows the energy generated from the KPT effect by the inductor 106 to be transferred to the coil 304. The rectifier 302 can then convert this energy to DC and store or output this voltage. In some embodiments, this electrical energy can be input back to the DC power supply 102 as discussed above in connection with FIG. 2.

Figure 5:
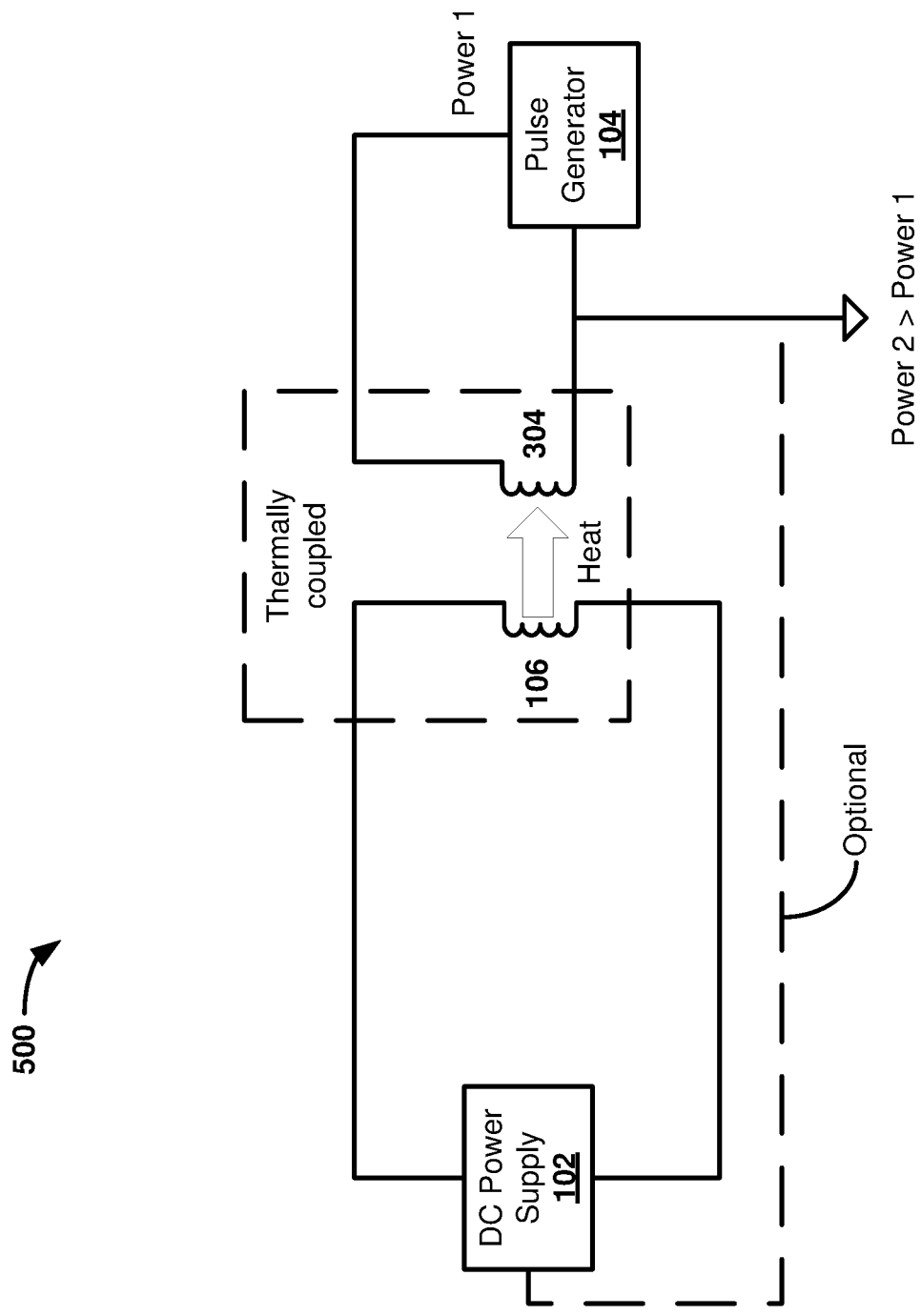
FIG. 5 is a block diagram of another exemplary magnetic field generator.

FIG. 5 shows an exemplary embodiment of another magnetic field generation circuit 500. In the embodiment of FIG. 5, the circuit 500 includes the DC power supply 102, the pulse generator 104, the inductor 106, and the coil 304. In the circuit 500, the DC power supply 102 supplies DC current to the inductor 106 to generate a magnetic field. The pulse generator 104 outputs electrical pulses, as described above, that cause the coil 304 to convert thermal energy to electrical energy by the KPT effect, thereby cooling the coil as described above. The inductor 106 and the coil 304 can be thermally coupled such that heat can be transferred from the inductor 106 to the coil 304. In the illustrated embodiment, the inductor 106 and the coil 304 can be thermally coupled by being wrapped around the same core. In other embodiments, the inductor 106 and the coil 304 can share a thermally conductive material that allows heat transfer between them or they can be positioned such that they can radiate heat between them. Thus, as the inductor 106 heats up from Joule heating, the coil 304 will be cooled by the KPT effect. As such, a temperature gradient exists between the inductor 106 and the coil 304. And because the inductor 106 and the coil 304 are thermally coupled, heat transfers from the inductor 106 to the coil 304, thereby cooling the inductor. This allows for additional current to be applied to the inductor 106 without overheating, thereby allowing for a stronger magnetic field to be generated by the inductor.

In addition, as explained above, the KPT effect causes the coil 304 to generate excess electrical power compared to the electrical power output by the pulse generator 104. In some embodiments, this excess electrical energy is applied to the DC power supply 102 to help power the DC power supply.

Figure 6:
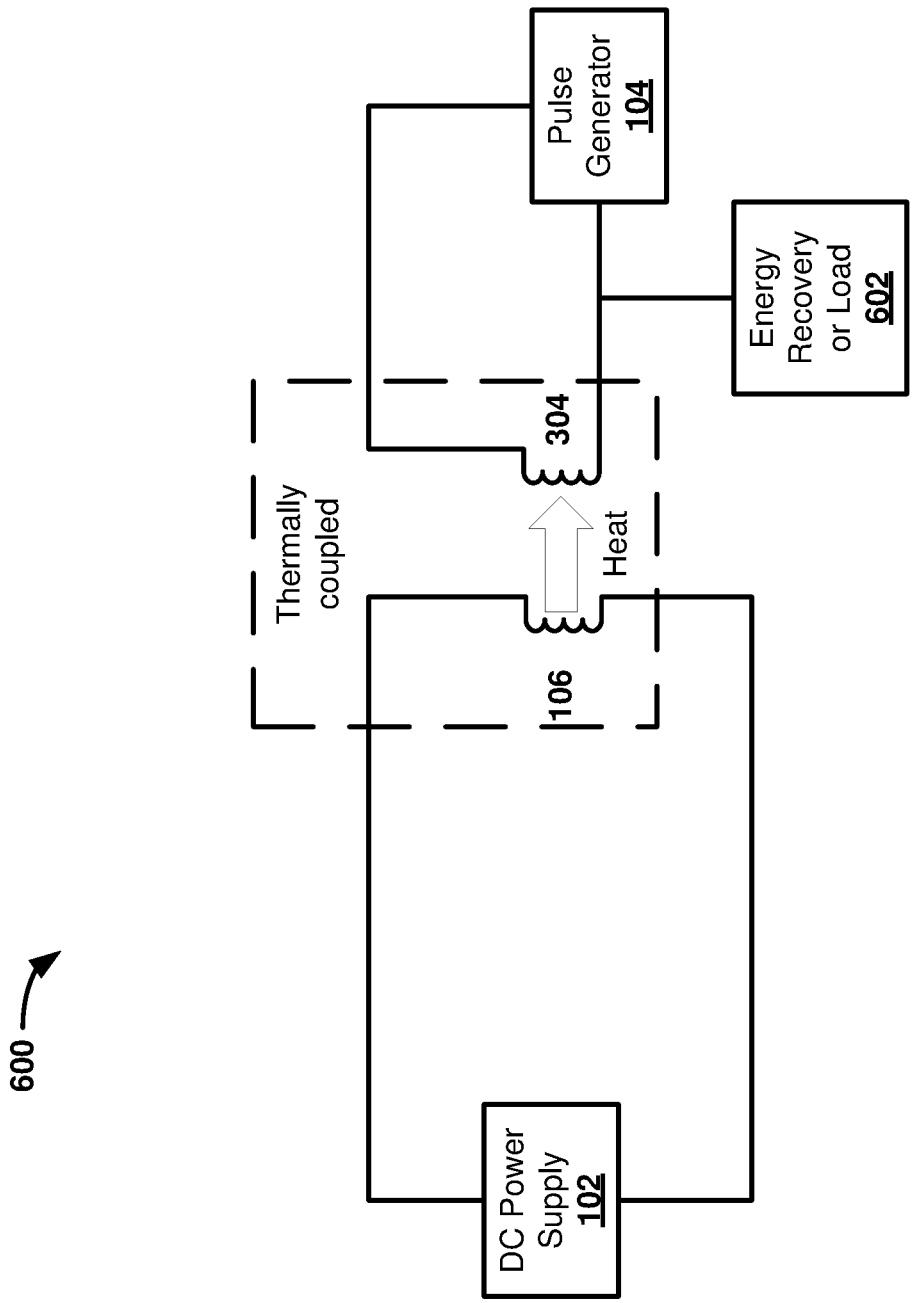
FIG. 6 is a block diagram of another exemplary magnetic field generator.

FIG. 6 shows an exemplary embodiment of another magnetic field generation circuit 600. The circuit 600 is the same as the circuit 500 except that the circuit 600 includes an energy recovery element or load 602. As explained above, the KPT effect causes the coil to generate electrical energy greater than the electrical energy output by the pulse generator 104. In the illustrated embodiment of FIG. 6, this excess energy is stored by the energy recovery element 602. In some embodiments, this excess energy is applied to a load rather than being stored.

Figure 7:
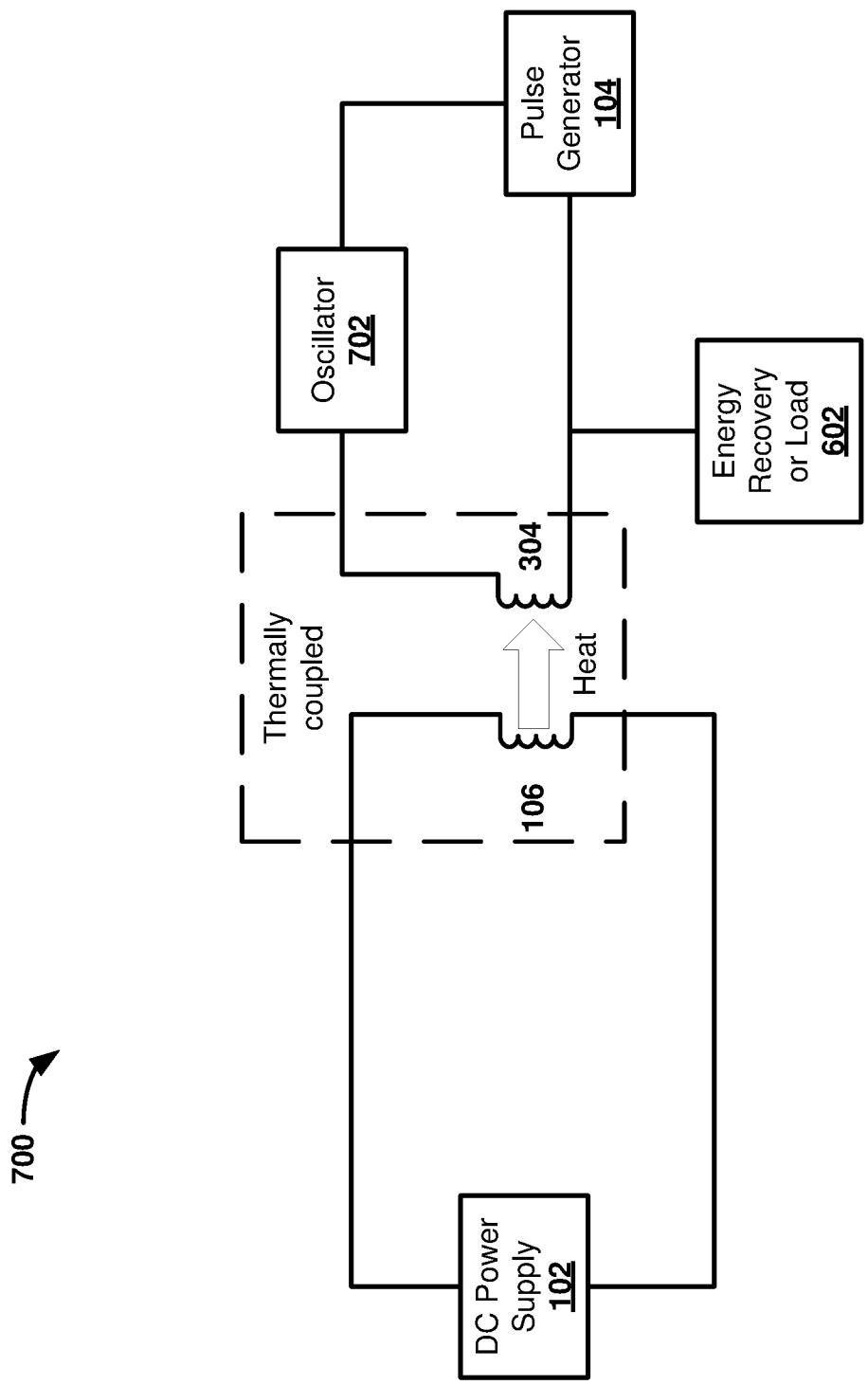
FIG. 7 is a block diagram of another exemplary magnetic field generator that includes an oscillator.

FIG. 7 shows an exemplary embodiment of another magnetic field generation circuit 700. The circuit 700 is the same as the circuit 600 of FIG. 6 except that the circuit 700 includes an oscillator 702 coupled in series with the pulse generator 104 and the coil 304. The oscillator 702 can be a harmonic oscillator and can output a periodic oscillating voltage when triggered by the pulse output by the pulse generator 104. Once triggered by a pulse output by the pulse generator 104, the oscillator 702 outputs a periodic signal to the coil 304. The strength of the signal output by the oscillator 702 decreases over time. However, each subsequent pulse output by the pulse generator 104 starts a new oscillation cycle. Thus, the oscillator 702 can be used to extend the amount of time that an input signal is supplied to the coil 304, even when the pulse generator 104 outputs a pulse having a very short pulse width.

In operation, the pulse generator 104 of FIG. 7 periodically outputs electrical pulses having a high dV/dt ratio. Each pulse can cause the oscillator 702 to output an oscillating signal to the coil 304. The coil 304 can cool and convert thermal energy into electrical energy to increase the power of the electrical signal it receives. Heat can be transferred from the inductor 106 to the coil 104 to provide additional thermal energy for the electrical element to convert to electrical energy. The signal with increased power can then be stored or consumed by the energy recovery element 602.

Figure 8:
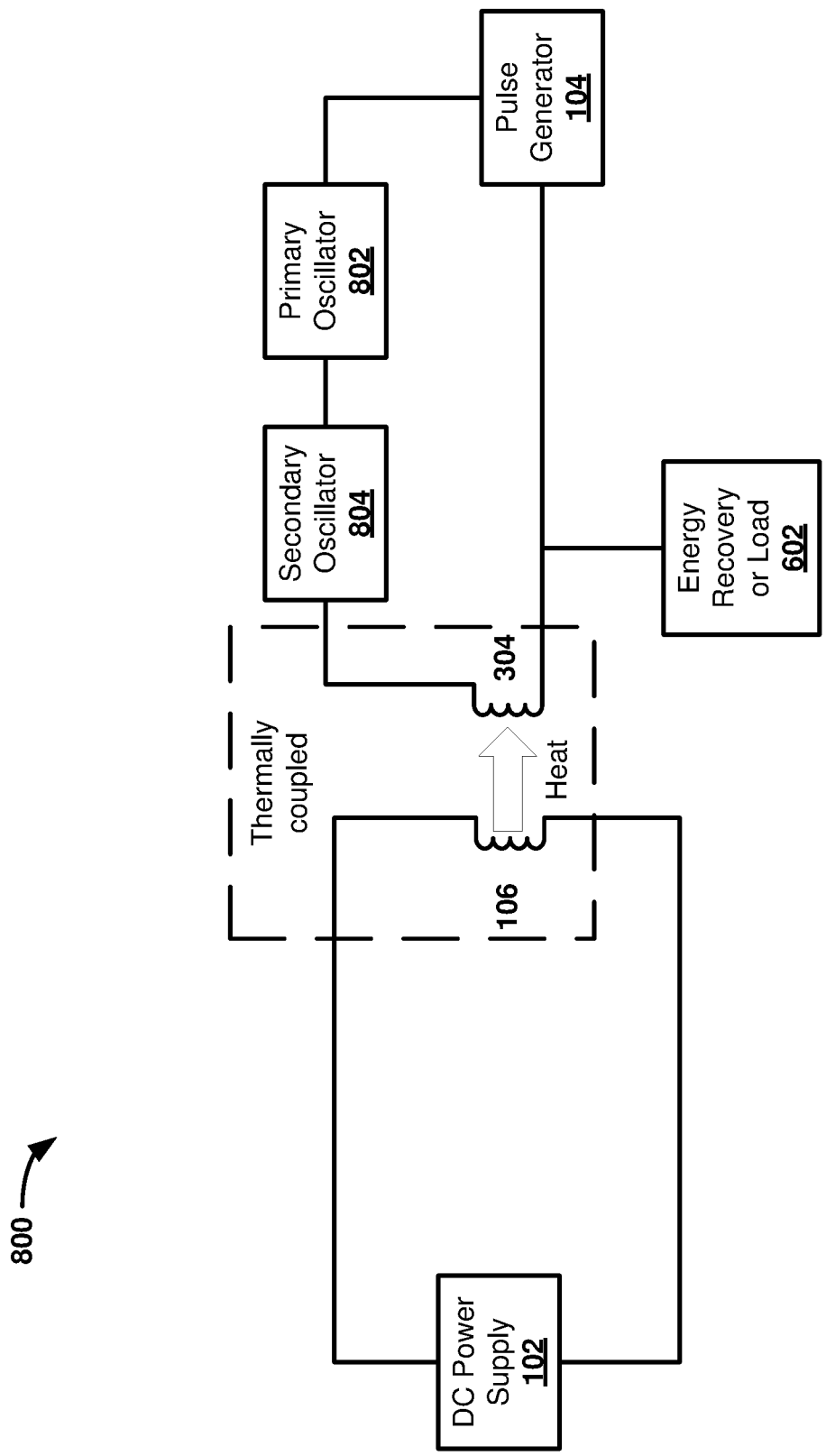
FIG. 8 is a block diagram of another exemplary magnetic field generator that includes a primary oscillator and a secondary oscillator.

FIG. 8 shows an exemplary embodiment of another magnetic field generation circuit 800. The circuit 800 is the same as the circuit 700 of FIG. 7 except that the circuit 800 includes a primary oscillator 802 and a secondary oscillator 804 rather than a single oscillator 702. The primary oscillator 802 can be similar to the oscillator 702 of FIG. 7. The secondary oscillator 804 can be configured such that when the primary oscillator 802 outputs an oscillating signal in response to a pulse from the pulse generator 104, the secondary oscillator 804 outputs a resonant oscillating signal having a higher frequency than the oscillating signal output by the primary oscillator 802. As such, the secondary oscillator 804 can magnify the signal applied to the coil 304. Like previous embodiments, the electrical energy output to the energy recovery element 602 is greater than the electrical energy output by the pulse generator 104. In the illustrated embodiment of FIG. 8, the primary oscillator 802 and the secondary oscillator 804 are shown coupled in series between the pulse generator 104 and the coil 304. Other configurations can also can be used, such as positioning the coil 304 between the primary and secondary oscillators 802, 804.

Figure 9:
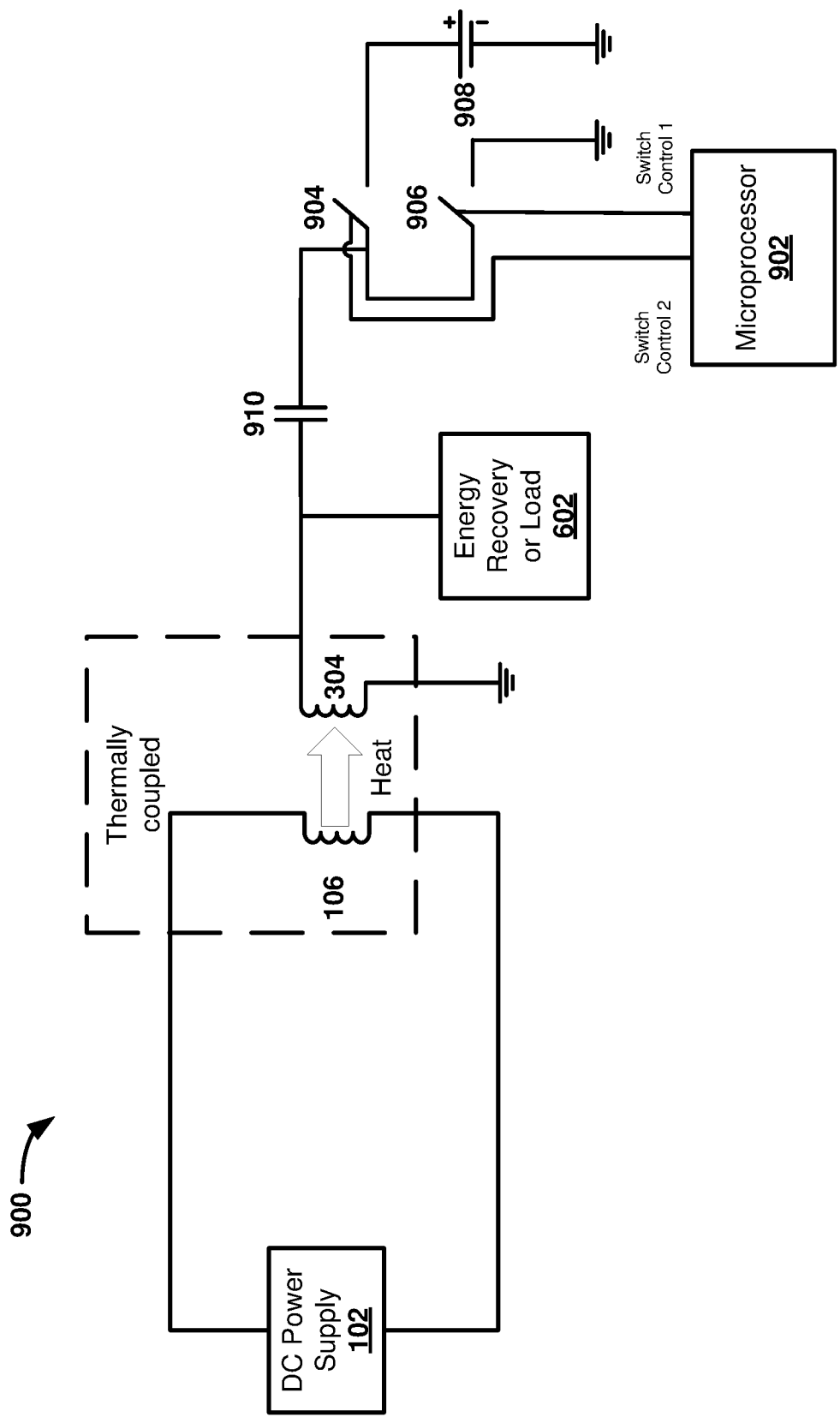
FIG. 9 is a block diagram of another exemplary magnetic field generator that includes a microprocessor.

FIG. 9 shows another exemplary embodiment of a magnetic field generation circuit 900. The circuit 900 is similar to the circuit 600 of FIG. 6 except that the pulse generator 104 is replaced by different circuit elements including a microprocessor 902, switches 904, 906, and capacitor 910. The circuit 900 can include a first switch 904 and a second switch 906 that can be controlled by the microprocessor 902. The microprocessor 902 can independently open and close the switches 904, 906. The first switch 904 can be connected to a power supply 908 and the second switch 906 can be connected to ground. The switches 904, 906 can be in parallel and can be connected to a capacitor 910. The microprocessor 902 can alternatingly open and close the switches 904, 906 so as to output a square wave. During a first time interval, the microprocessor 902 can close switch 904 and open switch 906. This causes the voltage from the power supply 908 to be applied to the capacitor 910, thereby causing a positive voltage to accumulate on one plate of the capacitor. During a second time interval, the microprocessor 902 can open the switch 904 and close the switch 906. This grounds the capacitor 910, thereby causing a negative voltage to appear on the capacitor plate. This process can then be continued, with the microprocessor 908 repeatedly opening one of the switches 904, 906 and closing the other one, thereby producing an alternating series of positive and negative voltages to appear on each plate of the capacitor 910. Thus, the voltage output by the capacitor 910 is a square wave with a high dV/dt ratio. In some examples, the switches 904, 906 can be replaced with transistors (e.g., CMOS transistors).

Figure 10:
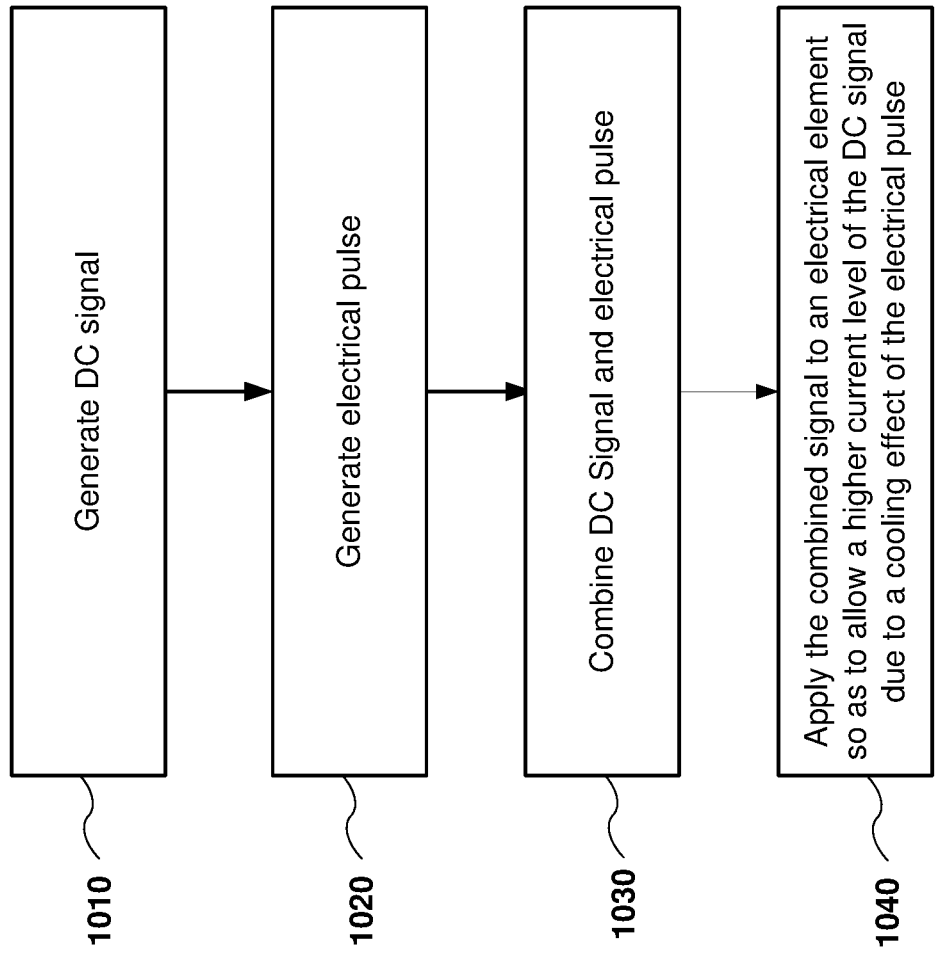
FIG. 10 illustrates an exemplary method of operating the magnetic field generator of FIGS. 1-9.

FIG. 10 is a flowchart outlining an example method of operating a magnetic field generation circuit with thermovoltaic cooling as can be performed in certain examples of the disclosed technology. For example, the depicted method can be performed by the circuit 100 and the description below is directed to FIG. 1, although other embodiments can be used.

At process block 1010, the DC power supply 102 generates a DC electrical signal. At process block 1020, the pulse generator 104 generates an electrical pulse. At process block 1030, the DC signal output by the DC power supply 102 and the electrical pulse output by the pulse generator 104 are combined. Combining the signal results in a single signal having a DC signal component and an electric pulse component. At process block 1040, the combined signal is applied to the inductor 106 to generate a magnetic field. Because of the KPT effect, the inductor 106 is cooled such that a higher current level can be applied to the inductor without overheating, thereby generating a stronger magnetic field than would otherwise be possible without the KPT effect.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

We claim:

1. A method comprising:
   generating a DC electrical signal;
   generating an electrical pulse;
   combining the DC electrical signal and the electrical pulse into a combined electrical signal having a DC electrical signal component and an electrical pulse component; and applying the combined electrical signal to an electrical element;
wherein the electrical element is configured to generate a magnetic field in response to receiving the DC electrical signal component, and wherein the electrical element is configured to cool in response to receiving the electrical pulse component.

2. The method of claim 1, wherein the electrical element comprises an inductive element.

3. The method of claim 1, further comprising:
applying electrical energy generated by the electrical element in response to receiving the electrical pulse to a power supply that generates the DC electrical signal.

4. The method of claim 1, further comprising:
applying electrical energy generated by the electrical element in response to receiving the electrical pulse to an energy recovery element.

5. The method of claim 1, further comprising:
applying electrical energy generated by the electrical element in response to receiving the electrical pulse to a load.

6. The method of claim 1, wherein the combining the DC electrical signal and the electrical pulse into a combined electrical signal comprises applying one of the DC electrical signal and the electrical pulse to a primary winding of a transformer, and applying the other of the DC electrical signal and the electrical pulse to the secondary winding of the transformer.

7. The method of claim 1, wherein a portion of the electrical pulse has a change in voltage with respect to time of at least 100 volts per second.

8. The method of claim 1, wherein an amplitude of the electrical pulse generated by the pulse generator is between 1-10% of an amplitude of the DC electrical signal.

9. The method of claim 1, wherein the electrical pulse is one in a series of continuous electrical pulses generated by a pulse generator.

10. The method of claim 1, wherein the DC electrical signal is generated by a DC power supply, and the electrical pulse is generated by a pulse generator, and wherein the DC power supply is coupled in parallel to the pulse generator.

11. The method of claim 10, further including generating a periodic oscillating voltage in response to the electrical pulse, wherein the periodic oscillating voltage contributes to the cooling of the electrical element.

12. A method comprising:
generating a DC electrical signal;
applying the DC electrical signal to a first electrical element;
generating an electrical pulse; and
applying the electrical pulse to a second electrical element;
wherein the first electrical element is configured to generate a magnetic field in response to receiving the DC electrical signal;
wherein the second electrical element is configured to cool in response to receiving the electrical pulse; and
wherein the first electrical element is thermally coupled to the second electrical element such that when the second electrical element is cooled, the first electrical element is cooled.

13. The method of claim 12, further comprising applying electrical energy generated by the second electrical element in response to receiving the electrical pulse to an energy recovery element.

14. The method of claim 12, further comprising applying electrical energy generated by the second electrical element in response to receiving the electrical pulse to a power supply that generates the DC electrical signal.

15. A method, comprising:
generating a DC electrical signal using a DC power supply;
generating a continuous stream of electrical pulses using a pulse generator;
combining the DC electrical signal and the electrical pulses into a combined electrical signal; and
applying the combined electrical signal to an electrical element;
wherein the electrical element is configured to cool in response to receiving the combined electrical signal.

16. The method of claim 15, wherein an amplitude of the electrical pulse generated by the pulse generator is between 1-10% of an amplitude of the DC electrical signal.

17. The method of claim 15, further including an oscillator coupled in series with the pulse generator, wherein the oscillator is responsive to the pulse generator to generate a periodic oscillating voltage.

18. The method of claim 17, wherein each of the electrical pulses generates a new oscillation cycle of the periodic oscillating voltage.

19. The method of claim 17, wherein the periodic oscillating voltage contributes to cool the electrical element.

20. The method of claim 15, wherein the pulse generator and the DC power supply are coupled to opposing windings of an inductor.

* * * * *